United States Patent
Chiavarone et al.

(10) Patent No.: US 7,940,568 B1
(45) Date of Patent: May 10, 2011

(54) DYNAMIC POLARIZATION FOR REDUCING STRESS INDUCED LEAKAGE CURRENT

(75) Inventors: Luca Chiavarone, Sulbiate (IT); Mattia Robustelli, Milan (IT); Angelo Visconti, Appiano Gentile (IT)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 12/346,472

(22) Filed: Dec. 30, 2008

(51) Int. Cl.
*G11C 11/34* (2006.01)
(52) U.S. Cl. .................................. 365/185.18
(58) Field of Classification Search ............... 365/185.18
See application file for complete search history.

(56) References Cited

U.S. PATENT DOCUMENTS

| | | | |
|---|---|---|---|
| 2004/0160839 A1* | 8/2004 | Kim | 365/222 |
| 2004/0264264 A1* | 12/2004 | Yaegashi et al. | 365/199 |
| 2006/0140009 A1* | 6/2006 | Lojek | 365/185.28 |

OTHER PUBLICATIONS

Patent Application filed Oct. 1, 2009 in co-pending U.S. Appl. No. 12/572,182, 27 pages.
Ielmini et al., "A new charge-trapping technique to extract SILC-trap time constants in $SIO_2$," IEDM Tech. Dig., S22.2, 4 pages, 2005.

* cited by examiner

*Primary Examiner* — Huan Hoang
*Assistant Examiner* — Anthan T Tran
(74) *Attorney, Agent, or Firm* — Berkeley Law & Technology Group, LLP

(57) ABSTRACT

Subject matter disclosed herein relates to non-volatile flash memory, and more particularly to a method of reducing stress induced leakage current.

14 Claims, 4 Drawing Sheets

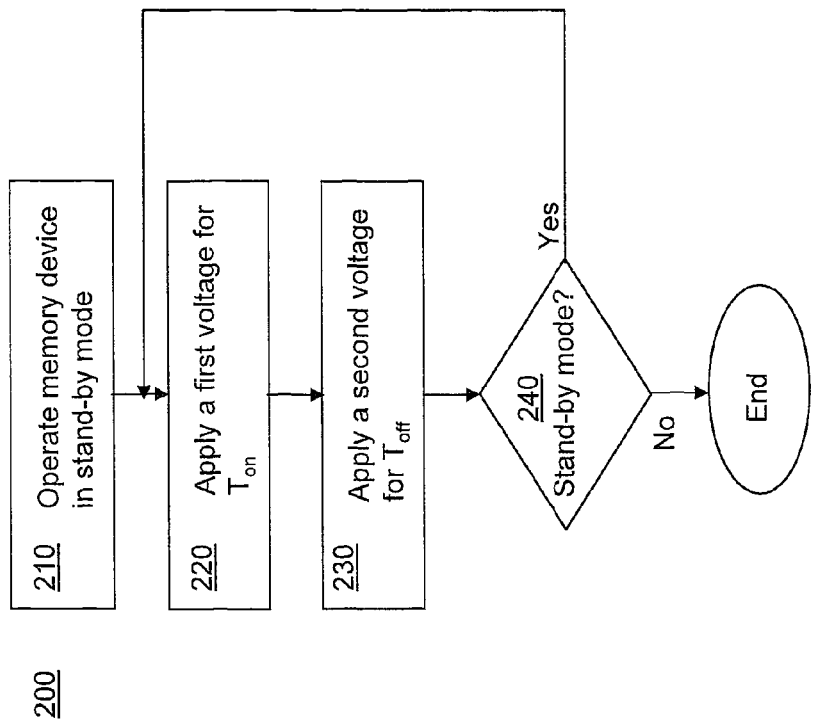
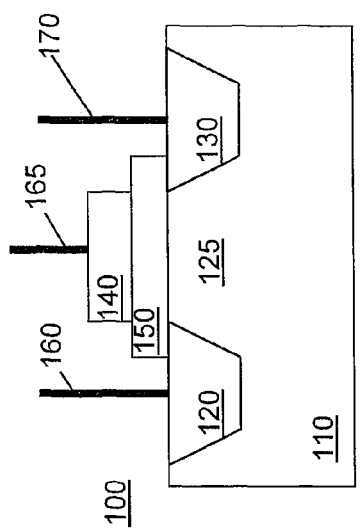
FIG. 1A
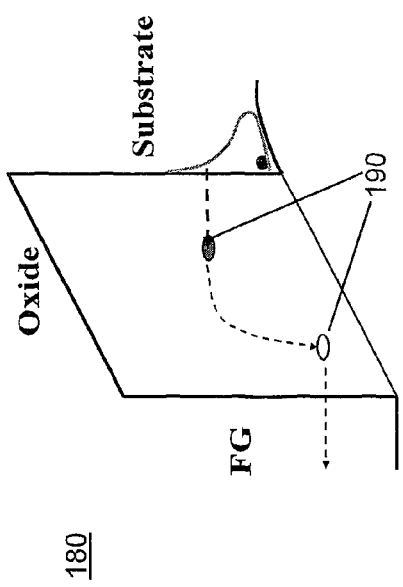
FIG. 1B
FIG. 2

"0" state:

"1" state:

DYNAMIC POLARIZATION FOR REDUCING STRESS INDUCED LEAKAGE CURRENT

BACKGROUND

1. Field

Subject matter disclosed herein relates to non-volatile flash memory.

2. Information

Flash memories typically preserve stored information even in power-off conditions. In such memories, in order to change a logic state of a cell, e.g. a bit, an electric charge present in a floating gate of the cell may be changed by application of electric potentials to various portions of the cell. A "0" state typically corresponds to a negatively charged floating gate and a "1" state typically corresponds to a positively charged floating gate. As intended, a non-volatile memory may preserve stored information over time, but a reliability of such a memory may be limited by degenerative processes affecting a tunnel oxide of the memory during various programming and erasing cycles. As a cell is programmed and erased, electrons move to and from the floating gate through the tunnel oxide. Such electrons may create "traps" in the oxide (i.e., defects in the oxide in which electrons may be trapped). Traps created in the tunnel oxide are typically responsible for stress induced leakage current (SILC), which is a leakage current typically observed at relatively low electric fields. Trap density may increase with the number of program and erase cycles experienced by the tunnel oxide. Due to the presence of these traps, a programmed or erased floating gate may show an enhanced charge loss and/or charge gain even under relatively low electric fields across the tunnel oxide commonly seen during normal conditions of storage and reading of the cell. Such low level charge loss and/or charge gain mechanisms, which may lead to information loss, are undesirable since flash memory devices are expected to be able to store information on the order of at least several years.

A physical model underlying SILC includes a trap assisted tunnel (TAT) model. A current loss, depending on its direction, may either lead to a charge gain or a charge loss. A charge gain may correspond to information loss for a "1" state, whereas a charge loss may correspond to information loss for a "0" state. In either case, such a logic state determined by charge on a floating gate may be lost, possibly leading to a memory failure. For example, a failure of the "0" state may occur if enough electrons flow from the floating gate to a substrate to reduce a threshold voltage of the memory cell affected by SILC to below a value used to discriminate a "0" state from a "1" state. Such a failure may be called a retention failure. In another example, a failure of the "1" state may occur on an erased cell belonging to the same word-line of a read cell. Such a cell may suffer a parasitic gate stress, which can induce a tunnel current from the substrate to the floating gate, possibly leading to unwanted programming. Such a condition is called read disturb and may be particularly pronounced on cells affected by SILC.

SILC is typically dependent on tunnel oxide thickness. SILC may strongly increase for tunnel oxide thicknesses below approximately 10 nm, for example. In addition, SILC strongly depends on the strength of an electric field applied to the tunnel oxide. Accordingly, SILC is a relatively important factor limiting the scaling of tunnel oxide thickness in flash memories.

BRIEF DESCRIPTION OF THE FIGURES

Non-limiting and non-exhaustive embodiments will be described with reference to the following figures, wherein like reference numerals refer to like parts throughout the various figures unless otherwise specified.

FIG. 1A is a schematic view of memory cell, according to an embodiment.

FIG. 1B is an energy band profile showing a tunneling electron, according to an embodiment.

FIG. 2 is a flow diagram of a process to reduce charge loss for a memory cell in a memory device, according to an embodiment.

DETAILED DESCRIPTION

Figure 3:
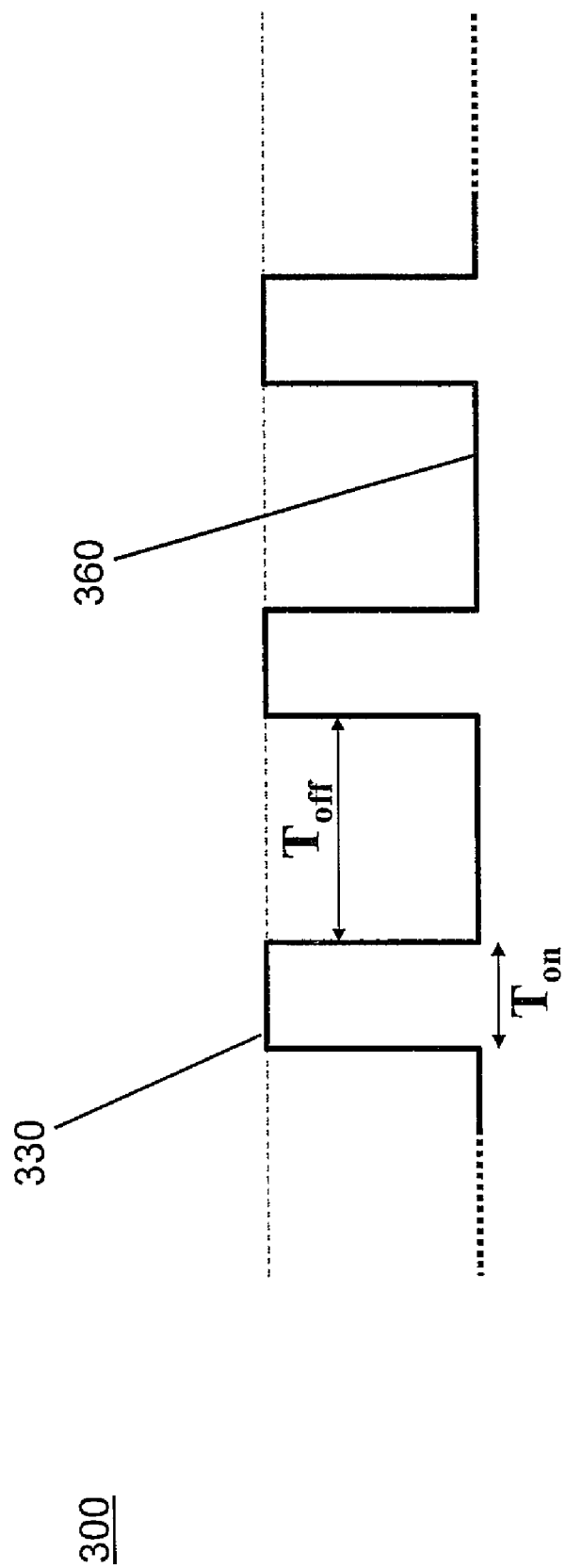
FIG. 3 is a schematic view of a voltage wave-form to generate dynamic polarization, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a memory cell, which may be in a "1" state or a "0" state, may comprise a portion of a non-volatile, memory device. Information may be read from and/or written to a memory cell. If information does not flow to/from a memory cell, such a memory cell may store information, such as during a standby or power off mode. If such a memory cell is operated in a standby or power off mode, the memory cell may be subjected to stress induced leakage current (SILC). Such leakage current may transfer charge into or out of a floating gate of the memory cell, leading to possible loss of stored information in the memory cell. For example, information loss of the "1" state may correspond to an increased charge on the floating gate of the memory cell, whereas information loss of the "0" state may correspond to a decreased charge on the floating gate. In a particular embodiment, a dynamic polarization may be applied via a terminal, such as a control gate, of a memory cell to reduce SILC-induced charge loss. Such a memory cell may be in a "0" state while in a standby mode. Accordingly, such a dynamically polarized memory cell may have improved storage capability. A dynamic polarization, for example, may comprise a polarization having a magnitude that varies with time. Such a polarization may be generated by applying an electric field and/or one or more voltages in a time-varying manner. For example, a voltage having a square-wave form may be applied to a terminal of a memory cell to generate a polarization having a square-wave form. Such a polarization may modify energies of electric charges stored in the memory cell. Accordingly, such a polarization may affect charge migration in portions of the memory cell, as explained below.

FIG. 1A is a schematic view of a memory cell 100, according to an embodiment. Such a memory cell may comprise a body or substrate 110, such as silicon, that includes doped regions 120, 125, and 130. For example, doped regions 120 and 130 may comprise source/drain n-doped regions, whereas intervening region 125 may comprise a p-doped channel region. In a particular implementation, doped region 130 may comprise a drain region so that line 170 may act as a bitline to the memory cell, and line 160 may act as a source line. Line 165 may comprise a wordline and/or a control gate controlling a floating gate 140 so that floating gate 140 may be responsive at least in part to voltages applied to control gate 165. An oxide layer 150 may be disposed between floating gate 140 and channel region 125.

FIG. 1B is an energy band profile 180 showing an electron tunneling through traps 190, according to an embodiment. A memory cell, such as memory cell 100 shown in FIG. 1A, may experience an electric field polarity that favors electron tunneling through oxide 150 from substrate 110 to floating gate 140 of the memory cell 100. It is noted that terms used herein such as favors, favorable, unfavorable, and so on refer to a statistical and probabilistic nature of electron tunneling. Accordingly, favorable implies statistically probable while unfavorable implies statistically improbable, for example. Returning to FIG. 1B, such an energy band profile may result from a voltage difference between a substrate and a floating gate, for example, as will be further explained below.

FIG. 2 is a flow diagram of a process 200 to reduce charge loss for a memory cell, such as memory cell 100 shown in FIG. 1A, according to an embodiment. As discussed above, such a charge loss may correspond to a failure probability resulting from SILC of the "0" state of the memory cell. At block 210, the device may be in a standby mode and memory cell 100 may be in either a "1" state or a "0" state. At block 220, a first portion of dynamic polarization may be applied via a terminal of memory cell 100. In a particular embodiment, such dynamic polarization may be applied via a control gate, such as line 165 controlling a floating gate 140. The first portion of dynamic polarization may be applied by applying a first voltage to the control gate. The first voltage may comprise a constant positive voltage, though in one particular implementation the first voltage may vary. The first voltage may be applied to control gate 165 for a duration $T_{on}$, after which a second portion of dynamic polarization may be applied via control gate 165, as at block 230. In one particular implementation, the second portion of dynamic polarization may be applied by applying a second voltage to the control gate. The second voltage may be smaller than the first voltage, and may be substantially zero volts, for example. The second voltage may be applied to control gate 165 for a duration $T_{off}$. At block 240, a determination may be made whether the device is still in standby mode. If not, as in the case where writing and/or reading operations may be applied to memory cell 100 for example, then process 200 may end. Otherwise, a portion of process 200 that includes blocks 220 through 240 may repeat cyclically.

FIG. 3 is a schematic view of a voltage wave-form 300 for generating dynamic polarization, according to an embodiment. Such dynamic polarization may comprise a pulsed polarization to generate a pulsed electric field between a floating gate and a substrate of a memory cell, for example. Wave-form 300 may include a first voltage 330 having a duration $T_{on}$ and a second voltage 360 having a duration $T_{off}$. A portion of wave-form 300 occurring during $T_{on}$ may be referred to as a $T_{on}$ phase, whereas a portion of wave-form 300 occurring during $T_{off}$ may be referred to as a $T_{off}$ phase. Such a waveform may be applied to a terminal, such as a control gate, of a memory cell in a "0" state to decrease a failure probability resulting from SILC. For example, first and second voltages described at blocks 220 and 230 in process 200 may correspond to first and second voltages 330 and 360 of wave-form 300, respectively. Parameters of a particular memory cell may determine, at least in part, values for first and second voltages 330 and 360. For example, such parameters may include a thickness of oxide 150 and other dimensions and/or materials of a memory cell. In a particular implementation, a first voltage may include voltages in the order of approximately 1.0 to 10.0 volts, and a second voltage may include voltages in the order of approximately −2.0 to 0.0 volts. Of course such voltages are merely examples, and first and second voltages may include other values as well. Accordingly, claimed subject matter is not limited to voltages mentioned in these examples. In another particular implementation, parameters of a particular memory cell may determine, at least in part, values for $T_{on}$ and/or $T_{off}$. For example, such parameters may include a thickness of oxide 150 and other dimensions and/or materials of a memory cell. $T_{on}$ and/or $T_{off}$ may include times in the order of approximately 0.1 to 1000 microseconds, for example. Of course such times are merely examples, and claimed subject matter is not so limited. In addition, although voltage wave-form 300 comprises a square-wave, other voltage wave-forms may be used to generate a dynamic polarization, such as a sinusoidal wave, a triangular wave, and a saw-tooth wave, just to name a few examples.

In an embodiment, a decrease of a failure probability of a memory cell in a "0" state resulting from SILC may correspond to a reduction of an electric field through a tunnel oxide, such as oxide 150 shown in FIG. 1A, during a $T_{on}$ phase of an applied dynamic polarization. Such an electric field between a substrate and a floating gate through a tunnel oxide may normally exist in a memory cell as a result of a certain amount of charge placed in the floating gate in the course of storing information. For example, such different voltages may exist if the memory cell is in a "0" state. As a result, the voltage difference may result in an electric field leading to an energy band profile, such as energy band profile 180 shown in FIG. 1B, for example. Applying a dynamic polarization, as explained above, may counteract, e.g., reduce, such an already-existing electric field. Accordingly, a reduced net electric field may result in a decreased probability for electrons to tunnel through oxide layer 150, for example. Decreasing a probability of tunneling may also decrease SILC, thus reducing the failure probability of a memory cell in a "0" state. Of course, such electric fields are merely examples, and claimed subject matter is not so limited.

As described above, applying a dynamic polarization to a memory cell in a "0" state may reduce an electric field that results in decreased electron tunneling, thus decreasing SILC. Unfortunately, the same dynamic polarization that may decrease SILC for a memory cell in a "0" state may increase SILC for a memory cell in a "1" state. Such an increased SILC may result from the fact that a floating gate of a memory cell in a "1" state may be positively charged, so that the applied dynamic polarization may favor increased electron tunneling from a substrate into the floating gate. This may reduce an amount of positive charge on the floating gate, leading to possible information loss. In contrast, as described above, a floating gate of a memory cell in a "0" state may be negatively charged, so that the applied dynamic polarization may favor a decreased electron tunneling from a substrate into the floating gate, thereby maintaining the amount of negative charge on the floating gate leading to improved information storage. Because a dynamic polarization may have opposing effects on a memory cell in a "1" state versus a "0" state, such a dynamic polarization may be intermittently and/or periodically applied. For example, such a periodic application may include wave-form 300 that includes a $T_{on}$ phase and a $T_{off}$ phase. In an embodiment, values for $T_{on}$ and $T_{off}$ may be selected for a periodically applied dynamic polarization so that $T_{on}$ is long enough to prevent electrons from tunneling into a substrate of a memory cell in a "0" state, while $T_{off}$ is long enough to allow any electrons that may have become trapped in an oxide during $T_{on}$ to tunnel back to a substrate of a memory cell in a "1" state, as explained below.

Figures 4A, 4B:
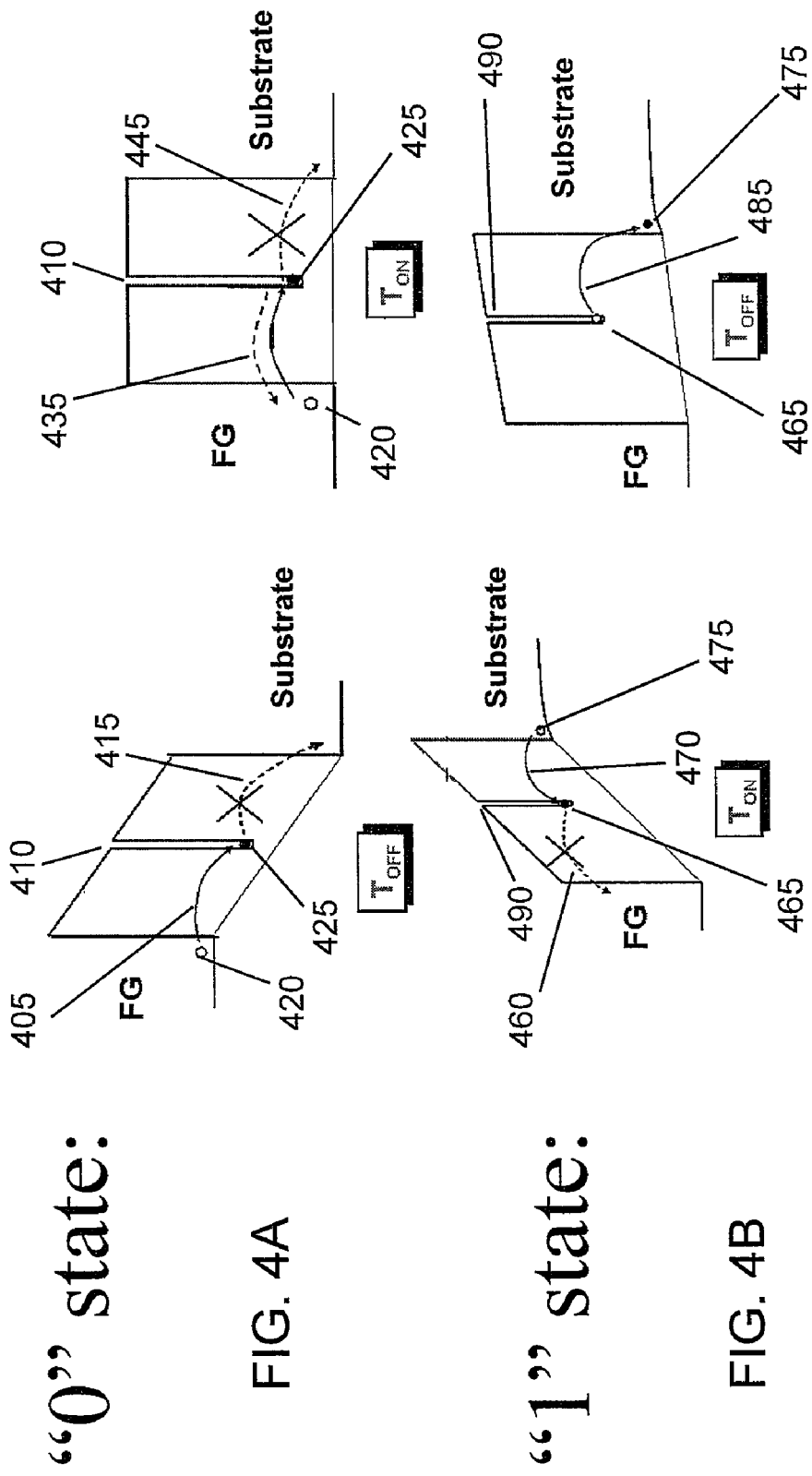
FIG. 4A shows energy band profiles for a memory cell in a "0" state including tunneling and trapped electrons, according to an embodiment.
FIG. 4B shows energy band profiles for a memory cell in a "1" state including tunneling and trapped electrons, according to an embodiment.

FIG. 4A shows energy band profiles for a memory cell in a "0" state including tunneling and trapped electrons, according to an embodiment. With no applied dynamic polarization, as during a $T_{off}$ phase, electrons 420 making up a charge on a floating gate may tunnel to a substrate, via tunnel processes 405 and 415. However, an applied dynamic polarization, as during a $T_{on}$ phase, may prevent electrons 420 on the floating gate from tunneling to the substrate, due at least in part to a relatively small net electric field between the floating gate and the substrate.

As shown in FIG. 4A for phase $T_{off}$, electrons 420 may tunnel from a floating gate towards a substrate via tunnel processes 405 and 415. During the course of tunneling across an oxide region, the electrons become trapped in an oxide trap 410. A trapped electron 425 is shown residing in oxide trap 410, for example. If $T_{off}$ is relatively short compared to $T_{on}$, a tunneling electron that is at least momentarily trapped in oxide trap 410 may not have enough time to tunnel from oxide trap 410 to the substrate, for example. In other words, oxide trap 410 may hold onto electrons trapped during their tunneling from the floating gate long enough during phase $T_{off}$ to give these trapped electrons 425 an opportunity to tunnel back to the floating gate during a subsequent $T_{on}$ phase. In such a case, the $T_{off}$ phase may be short enough to prevent tunnel process 415. Of course, such examples may be simplified in that tunneling processes of relatively large numbers of electrons may primarily be statistically determined. In any case, claimed subject matter is not limited to such examples.

Returning to FIG. 4A for phase $T_{on}$, trapped electrons 425 may now have an opportunity to tunnel from oxide trap 410 to the floating gate via tunnel process 435, for example. Meanwhile, tunnel process 445 from the oxide trap 410 to the substrate may become unfavorable, so that substantially the electron 425 that tunneled out of the floating gate to oxide trap 410 during the previous $T_{off}$ phase has a favorable chance to return to the floating gate via tunnel process 435 during the $T_{on}$ phase, for example.

FIG. 4B shows energy band profiles for a memory cell in a "1" state including tunneling and trapped electrons, according to an embodiment. With an applied dynamic polarization, as during a $T_{on}$ phase, electrons 475 on a substrate may tunnel to a floating gate, via tunnel processes 460 and 470. If enough such tunneling electrons add to a charge on the floating gate, stored information may be lost. However, during a $T_{off}$ phase electrons that tunneled during $T_{on}$ and subsequently became trapped electrons 465 may now reverse direction and tunnel back to the substrate, for example. Such reverse-direction tunneling may be due at least in part to a relatively small net electric field between the floating gate and the substrate.

As shown in FIG. 4B for phase $T_{on}$, electrons 475 may tunnel from a substrate towards a floating gate via tunnel processes 460 and 470. During the course of tunneling across an oxide region, the electrons become trapped in an oxide trap 465. A trapped electron 465 is shown residing in oxide trap 490, for example. If $T_{on}$ is relatively short compared to $T_{off}$, a tunneling electron that is at least momentarily trapped in oxide trap 490 may not have enough time to tunnel from oxide trap 490 to the floating gate, for example. In other words, oxide trap 490 may hold onto electrons trapped during their tunneling from the substrate long enough during phase $T_{on}$ to give these trapped electrons 465 an opportunity to tunnel back to the substrate during a subsequent $T_{off}$ phase. In such a case, the $T_{on}$ phase may be short enough to prevent tunnel process 460. Of course, such examples may be simplified in that tunneling processes of relatively large numbers of electrons may primarily be statistically determined. In any case, claimed subject matter is not limited to such examples.

Returning to FIG. 4B for phase $T_{off}$, trapped electrons 465 may now have an opportunity to tunnel from oxide trap 490 to the substrate via tunnel process 485, for example. Meanwhile, a tunnel process from the oxide trap 490 to the floating gate may become relatively less favorable compared to the case for $T_{on}$, so that a substantial number of electrons 465 that tunneled out of the substrate to oxide trap 490 during a previous $T_{on}$ phase may return to the substrate via tunnel process 485 during the $T_{off}$ phase.

In an embodiment, a numerical evaluation may be performed in order to determine values for $T_{on}$ and $T_{off}$. Consider a case where a control gate voltage, $V_{cg}$ is equal to $V_{th}-V_{t,UV}$, where $V_{th}$ and $V_{t,UV}$ are the programmed threshold voltage and the UV threshold voltage of a memory cell, respectively. As a consequence, an electric field through a tunnel oxide of the memory cell may be substantially zero, so that a SILC current may be negligible. Generally, in order to decrease a memory cell failure probability by a factor of ten, for example, a memory storage time is to be reduced by multiplying by a factor of 0.2. A relation between $T_{on}$ and $T_{off}$ may be obtained by considering such a factor along with the relation $(T_{on}+T_{off})*N=T_{stadby}$, where N is the number of pulses of a square waveform, and $T_{stadby}$ is the time span for which the memory cell is operated in a standby mode. SILC may affect the memory cell during a total period during which a dynamic polarization is not applied, which may be expressed as $T_{off}*N$. Setting the latter relation equal to $0.2*T_{standby}$ yields $T_{off}*N=0.2*T_{standby}$. Finally, combining the latter relation with $(T_{on}+T_{off})*N=T_{standby}$ yields the ratio $T_{on}/T_{off}=4$, which may indicate that $T_{on}$ may be four times greater than $T_{off}$ to reduce a SILC failure probability for the "0" state by a factor of ten. Of course, such an estimate of a relation between $T_{on}$, $T_{off}$, and a SILC failure probability is merely an example, and claimed subject matter is not so limited.

Figure 5:
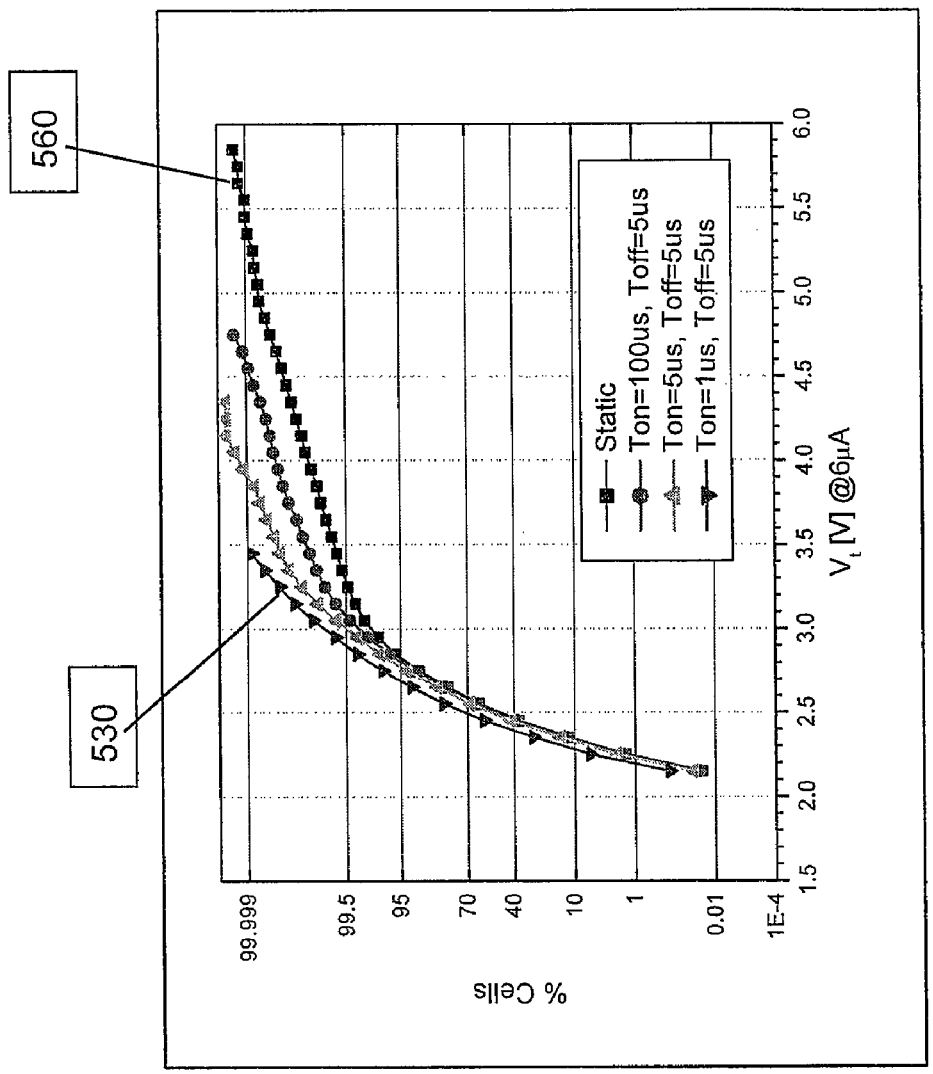
FIG. 5 is a graph showing measured cumulative distribution of threshold voltages of a population of memory cell in a "1" state for various polarization duty cycles, according to an embodiment.

FIG. 5 is a graph 500 showing measured cumulative distribution of threshold voltages of a population of memory cells in a "1" state for various polarization duty cycles, according to an embodiment. Curves 530 and 560, for example, may represent a same stress time, which is the sum of all $T_{on}$ pulses, so that the shorter the $T_{on}$, the greater the number of pulses applied, for example. Regarding the horizontal axis, Vt is the threshold voltage of a population of memory cells, which may comprise a measure of charge on floating gates of the memory cells. Such a threshold voltage may be used to discriminate between "0" and "1" states of the memory cell. For example, Vt below a reference value may correspond to a "1" state whereas Vt above the reference value may correspond to a "0" state. Regarding the vertical axis, "% cells" indicates the percentage of memory cells having a threshold voltage below a particular Vt. For example, 99.5% of the cells have a threshold voltage below 3.5V for curve 560 in FIG. 5. Curve 560 represents the case for $T_{on}$ always and $T_{off}=0$, so that a static polarization is applied to the memory cell. In this case, curve 560 demonstrates that a greater number of memory cells compared to those represented by curve 530 have an increased floating gate charge (higher Vt). A higher Vt for a memory cell in a "1" state may present an increased risk that such a memory cell may not be read as a "1" state, so that stored information may be lost. Accordingly, decreasing $T_{on}$ relative to $T_{off}$, at least for implementations presented in FIG. 5, may provide some benefit to extending memory storage times. Of course, such conditions are merely examples, and claimed subject matter is not so limited.

In an embodiment, operating a memory device in a standby mode may include switching off a relatively large portion of memory device circuits, thereby reducing power consumption. To implement a dynamic polarization as described above, however, may involve additional power consumption to apply voltage pulses to word-lines of the memory device, for example. Such a memory device may comprise multiple blocks of memory cells. In one particular implementation, a dynamic polarization may be applied sequentially to individual word-lines within the multiple memory blocks. In such a case, values for a $T_{on}/T_{off}$ ratio may be fixed by the number of word-lines to the memory cells. Such a constraint may result from word-lines that are to be biased by the dynamic polarization one by one. For example, 32 word-lines may result in $T_{off}=31*T_{on}$. In another particular implementation, a dynamic polarization may be applied block by block, so that substantially all word-lines for a block are biased by the dynamic polarization together. As a result, there need not be a constraining relation between $T_{on}$ and $T_{off}$ as in the case above. Of course, such biasing of portions of a memory device is merely an example, and claimed subject matter is not so limited.

In one embodiment, a dynamic polarization may be applied via a body of a memory cell, such as substrate 110 shown in FIG. 1A. In such a case, a wave-form, such as wave-form 300 shown in FIG. 3, may include a first voltage 330 having a duration $T_{on}$ and a second voltage 360 that is negative having a duration $T_{off}$. Such a waveform may be applied to a body of a memory cell in a "0" state during standby phase to decrease a failure probability resulting from SILC, as described above.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
   operating a non-volatile memory device in a standby mode; and
   applying a dynamic polarization via a control gate of a memory cell of said non-volatile memory device while said non-volatile memory device is operating in said standby mode, wherein said applying said dynamic polarization further comprises:
   applying a control voltage to said control gate, wherein said control voltage comprises amplitude that is:
   at least a first amplitude for a first time span; and
   less than or equal to a second amplitude for a second time span, wherein said first amplitude is positive and greater than said second amplitude.

2. The method of claim 1, wherein said non-volatile memory device comprises a flash memory device.

3. The method of claim 1, wherein said dynamic polarization is applied via a body of said memory cell.

4. The method of claim 1, further comprising:
   storing a "0" state in said memory cell, wherein said "0" state corresponds to a negatively charged floating gate responsive at least in part to said dynamic polarization.

5. The method of claim 1, wherein said applying said dynamic polarization comprises applying a square wave voltage to said memory cell.

6. The method of claim 1, wherein said dynamic polarization comprises a pulsed polarization to generate a pulsed electric field between a said floating gate and a substrate of said memory cell.

7. The method of claim 1, further comprising:
   applying said dynamic polarization to a block of memory cells of said non-volatile memory device during said standby mode operation.

8. A non-volatile memory device comprising:
   a memory cell array including a memory cell having a control gate; and
   a controller adapted to apply a dynamic polarization via said control gate of said memory cell during a standby mode operation of said memory cell, wherein said dynamic polarization comprises a control voltage applied to said control gate, and wherein said control voltage comprises amplitude that is:
   at least a first amplitude for a first time span; and
   less than or equal to a second amplitude for a second time span, wherein said first amplitude is positive and greater than said second amplitude.

9. The non-volatile memory device of claim 8, wherein said memory cell array comprises a flash memory cell array.

10. The non-volatile memory device of claim 8, wherein said dynamic polarization comprises a square wave voltage.

11. The non-volatile memory device of claim 8, wherein said dynamic polarization comprises a pulsed polarization to generate a pulsed electric field between a floating gate and a substrate of said memory cell.

12. The non-volatile memory device of claim 11, wherein said memory cell is adapted to store a "0" state, wherein said "0" state corresponds to a floating gate being negatively charged.

13. The non-volatile memory device of claim 8, further comprising:
   a block of memory cells, wherein individual memory cells are adapted to receive said dynamic polarization.

14. The non-volatile memory device of claim 8, wherein said control gate is connected to a word line of said memory cell array.

* * * * *

UNITED STATES PATENT AND TRADEMARK OFFICE
CERTIFICATE OF CORRECTION

| | | |
|---|---|---|
| PATENT NO. | : 7,940,568 B1 | |
| APPLICATION NO. | : 12/346472 | |
| DATED | : May 10, 2011 | |
| INVENTOR(S) | : Luca Chiavarone et al. | |

It is certified that error appears in the above-identified patent and that said Letters Patent is hereby corrected as shown below:

In column 8, line 19, in Claim 6, after "between a" delete "said".

Signed and Sealed this
Twenty-eighth Day of June, 2011

David J. Kappos
*Director of the United States Patent and Trademark Office*